United States Patent
Yang et al.

(10) Patent No.: US 9,691,495 B2
(45) Date of Patent: Jun. 27, 2017

(54) MEMORY ARRAY WITH RAM AND EMBEDDED ROM

(71) Applicant: FREESCALE SEMICONDUCTOR, INC., Austin, TX (US)

(72) Inventors: Jianan Yang, Austin, TX (US); Scott I. Remington, Austin, TX (US); Shayan Zhang, Cedar Park, TX (US)

(73) Assignee: NXP USA, INC., Austin, TX (US)

( * ) Notice: Subject to any disclaimer, the term of this patent is extended or adjusted under 35 U.S.C. 154(b) by 53 days.

(21) Appl. No.: 14/447,515

(22) Filed: Jul. 30, 2014

(65) Prior Publication Data

US 2016/0035433 A1    Feb. 4, 2016

(51) Int. Cl.
| | |
|---|---|
| *G11C 17/08* | (2006.01) |
| *G11C 5/06* | (2006.01) |
| *G11C 11/419* | (2006.01) |
| *G11C 5/14* | (2006.01) |
| *G11C 11/00* | (2006.01) |
| *G11C 11/412* | (2006.01) |
| *G11C 11/417* | (2006.01) |

(52) U.S. Cl.
CPC .......... *G11C 17/08* (2013.01); *G11C 11/005* (2013.01); *G11C 11/412* (2013.01); *G11C 11/417* (2013.01); *G11C 11/419* (2013.01)

(58) Field of Classification Search
CPC ..................................................... G11C 17/08
USPC .......................................................... 365/72
See application file for complete search history.

(56) References Cited

U.S. PATENT DOCUMENTS

| | | | | |
|---|---|---|---|---|
| 5,311,464 A | * | 5/1994 | Takase ..................... | G11C 7/20 365/156 |
| 5,365,475 A | * | 11/1994 | Matsumura et al. ......... | 365/154 |
| 5,432,742 A | * | 7/1995 | Ihara ..................... | G11C 11/005 365/104 |
| 5,867,443 A | * | 2/1999 | Linderman ........... | G11C 11/412 365/154 |
| 5,923,582 A | * | 7/1999 | Voss .............................. | 365/154 |
| 6,041,008 A | * | 3/2000 | Marr ..................... | G11C 11/005 365/154 |
| 6,128,218 A | * | 10/2000 | You ....................... | G11C 11/005 365/154 |
| 6,707,696 B1 | | 3/2004 | Turner et al. | |
| 6,856,531 B2 | | 2/2005 | Turner et al. | |
| 7,920,411 B2 | * | 4/2011 | Chang et al. ................. | 365/156 |
| 8,081,525 B2 | * | 12/2011 | Komatsu ............... | G11C 11/005 365/154 |

(Continued)

*Primary Examiner* — Alexander Sofocleous
*Assistant Examiner* — Mushfique Siddique (57) ABSTRACT

A memory array with RAM and embedded ROM including multiple RAM cells, a ROM cell, and a ROM enable circuit. Each RAM cell has a RAM cell structure with a first and second power terminals and configured to operate as a RAM cell when the memory array is in a RAM mode. The ROM cell has the same RAM cell structure in which at least one transistor is modified to cause the ROM cell to have a predetermined logic state. The ROM enable circuit enables bit lines of the ROM cell to control supply voltages provided to the power terminals of the RAM cells so that they settle to predetermined logic states in a ROM mode. The modified transistor has a pseudo transistor structure having a modified substrate that operates as a resistance, such as a doping region in the substrate having the same polarity type as the substrate.

20 Claims, 6 Drawing Sheets

(56) References Cited

U.S. PATENT DOCUMENTS

| | | | |
|---|---|---|---|
| 8,995,178 B1* | 3/2015 | Yang | G11C 11/412 |
| | | | 365/156 |
| 2002/0089873 A1* | 7/2002 | Gold | G11C 11/005 |
| | | | 365/154 |
| 2008/0170430 A1* | 7/2008 | Miller | G11C 11/005 |
| | | | 365/156 |
| 2010/0080035 A1 | 4/2010 | Venkatraman et al. | |
| 2010/0214824 A1* | 8/2010 | Chang | G11C 11/412 |
| | | | 365/156 |

* cited by examiner

MEMORY ARRAY WITH RAM AND EMBEDDED ROM

BACKGROUND OF THE INVENTION

Field of the Invention

The present disclosure relates generally to memory arrays, and more specifically to a random-access memory array including modified memory cells that enable read-only memory to be embedded within the memory array.

Description of the Related Art

Counterfeiting is costing integrated circuit (IC) design companies a substantial amount of revenue and often causes product-name and customer loyalty damage. There are several different types of counterfeiting semiconductor products, such as recycling (in which parts are pulled off boards and improperly resold), re-marketing (in which the counterfeiter improperly repackages parts from another and resells the repackaged parts as their own), manufacturing overproduction (in which a semiconductor manufacturer over-produces and sells otherwise legitimate devices in violation of their agreement), and cloning (in which a hacker reverse-engineers and manufactures and sells the re-engineered parts often in violation of the legitimate owner's intellectual property rights).

Cloning is the process of extracting the layout and design of an IC, generating a corresponding mask or database of the extracted information, and fabricating a cloned IC intended to copy or match the original function to the extent possible. Part of the process includes exposing layers or devices of the IC and inspecting the exposed portions using a high-powered microscope or the like. Cloning may include extracting the code of a ROM chip or embedded ROM. Although many policing or legal methods may be employed to reduce counterfeiting, it is particularly advantageous if the part or manufacturing process itself is configured to reduce or otherwise prevent cloning.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale.

DETAILED DESCRIPTION

The present inventors have recognized that hackers are able to reverse-engineer a read-only memory array for purposes of copying the stored code. The present inventors have therefore developed a memory array incorporating two different types of memory cells that appear substantially identical to each yet which perform different functions. The first cell type is configured according to a normal random access memory (RAM) cell that performs both RAM and read-only memory (ROM) functions depending upon the operating mode and connectivity. In a normal mode, the first cell type operates as a normal RAM cell. In a ROM mode, selected ones of the first cell type operate as ROM cells each having a logic value based upon its connectivity. The second cell type is configured substantially the same as the normal RAM cell, but is modified to include at least one "pseudo" transistor that is effectively indistinguishable from a normal transistor. The second cell type, which is a modified version of the first cell type, operates as a key ROM bit that is activated during the ROM mode to modify supply voltage provided to selected cells of the first cell type as ROM cells. The memory array, therefore includes RAM cells with embedded ROM, which saves area, reduces power, and makes hacking substantially more difficult if not prohibitive.

Figure 1:
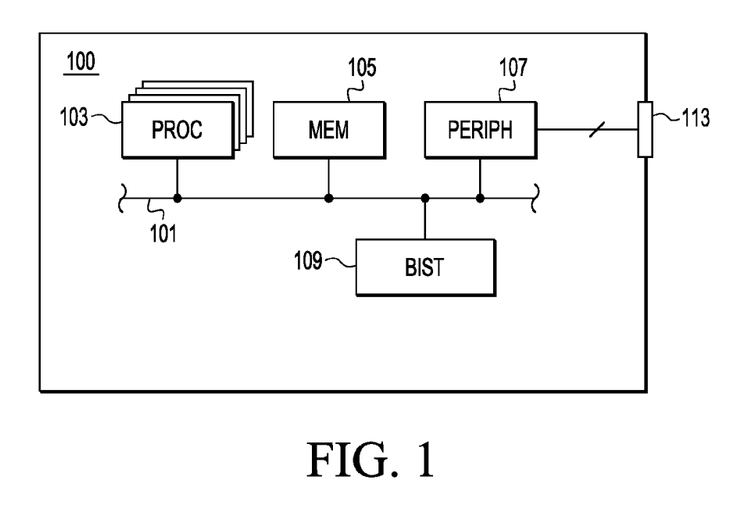
FIG. 1 is a simplified block diagram of an integrated circuit (IC) incorporating a memory system which includes a memory array with RAM and embedded ROM according to one embodiment.

FIG. 1 is a simplified block diagram of an integrated circuit (IC) 100 incorporating a memory system 105 which includes a memory array (201, FIG. 2) with RAM and embedded ROM according to one embodiment. The IC 100 includes one or more processors 103 coupled to the memory system 105 and a peripheral interface 107, which interface each other via a system interface 101. The IC 100 may further include an internal built-in self test (BIST) system 109 or the like coupled to the system interface 101 for testing system components and functions within the IC 100. The test system 109 may be configured to perform other test operations, such as boundary scan operations, debug operations, calibration operations, etc. The IC 100 may be coupled to an external system (not shown) via one or more input/output (I/O) pins of an I/O interface 113, in which the external system may include any number or amount of external devices, such as peripherals, power management devices, external memory, etc. The IC 100 is configured to perform any type of consumer, commercial, or industrial application, including, for example, computing, networking, medical, and automotive applications.

In one embodiment, the IC 100 is configured as a system-on-a-chip (SOC) configuration, although alternative configurations are contemplated. In one embodiment, the IC 100 is configured as a microcontroller or the like in which the memory system 105 incorporates ROM information, such as basic input/output system (BIOS) code and/or startup configuration routines or the like. In a conventional configuration, the RAM and ROM were provided on separate portions or contained within separate areas of the chip. The conventional ROM configuration was vulnerable to hacker methods in which the stored information was often exposed via hacker techniques and copied. The memory system 105, however, includes a memory array 201 with RAM and embedded hacker-proof ROM as further described herein.

Figure 2:
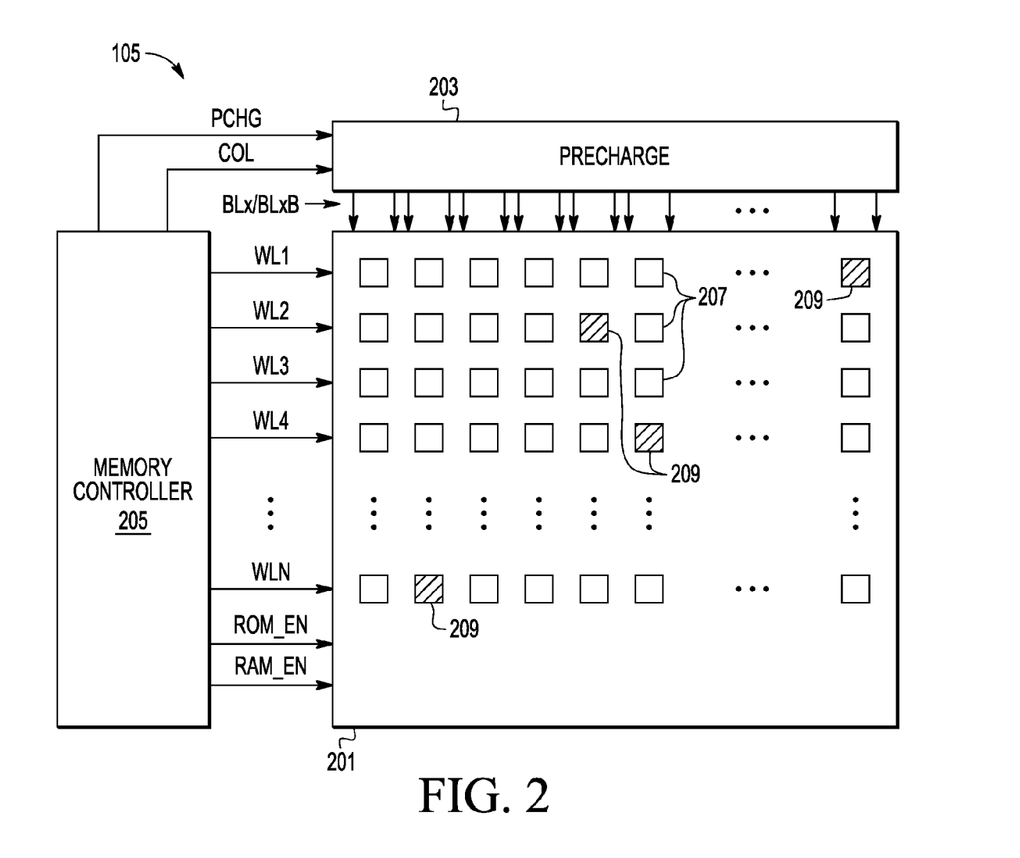
FIG. 2 is a simplified block diagram of the memory system of FIG. 1 including the memory array implemented according to one embodiment.

FIG. 2 is a simplified block diagram of the memory system 105 implemented according to one embodiment. The memory system 105 includes the memory array 201, a precharge circuit 203, and a memory controller 205. Many other details, such as I/O interfaces and various read/write control signals are not shown as not necessary for a complete understanding of the illustrated embodiment. The memory array 201 is configured to operate in one of two operating modes, including a RAM mode and a ROM mode, as controlled by enable signals ROM_EN and RAM_EN provided by the memory controller 205. The memory array 201 includes multiple RAM cells 207, each configured to perform RAM functions during the RAM mode, in which selected ones of the RAM cells 207 are also configured to perform ROM functions during the ROM mode as further described herein. The RAM cells 207 may be organized into rows and columns or the like. It is understood, however, that the terms "row" and "column" are arbitrary terms and that any particular memory organization is contemplated. Certain ones of the RAM cells 207 are replaced by, or otherwise configured as, ROM key cells 209, which are shown with diagonal shading lines. The ROM key cells 209 may be arbitrarily located, and are electrically coupled to configure selected ones of the RAM cells 207 to perform ROM functions during the ROM mode. As further described herein, the ROM key cells 209 are physically constructed in substantially the same manner as the RAM cells 207 and are essentially visually indistinguishable from the RAM cells 207. Thus, the ROM information stored within the memory array 201 is resistant to hackers if not completely hacker-proof.

The memory controller 205 asserts a precharge signal PCHG and a column access signal COL to the precharge circuit 203. In response, the precharge circuit 203 precharges non-inverted and inverted bit line signals BLx/BLxB along columns of memory cells of the memory array 201, in which "x" denotes an index value that ranges from zero or one to the total number of columns, and in which a "B" appended to a signal name (e.g., BLB) generally denotes an inverted version of the signal unless otherwise specified. The memory controller 205 also asserts a word line signal for each of N rows, WL1, WL2, . . . , WLN.

The memory controller 205 asserts the RAM_EN signal high and the ROM_EN signal low in order to place the memory array 201 in the RAM mode for performing RAM operations. In the RAM mode, data is written to and read from the memory array 201 in a conventional manner. The memory controller 205 asserts the ROM_EN signal high and the RAM_EN signal low in order to place the memory array 201 into the ROM mode for performing ROM operations. In the ROM mode, the ROM key cells 209 are activated to control the power source of selected ones of the RAM cells 207 based on circuit connection, in which the selected RAM cells 207 are driven to predetermined logic values. In the ROM mode, the memory array 201 is essentially converted into a ROM device that stores predetermined ROM information. Although a single mode control signal may be used to switch between RAM and ROM modes, two separate mode signals allows an intermediate state when both ROM_EN and RAM_EN are low for initialization or reset functions.

Figure 3:
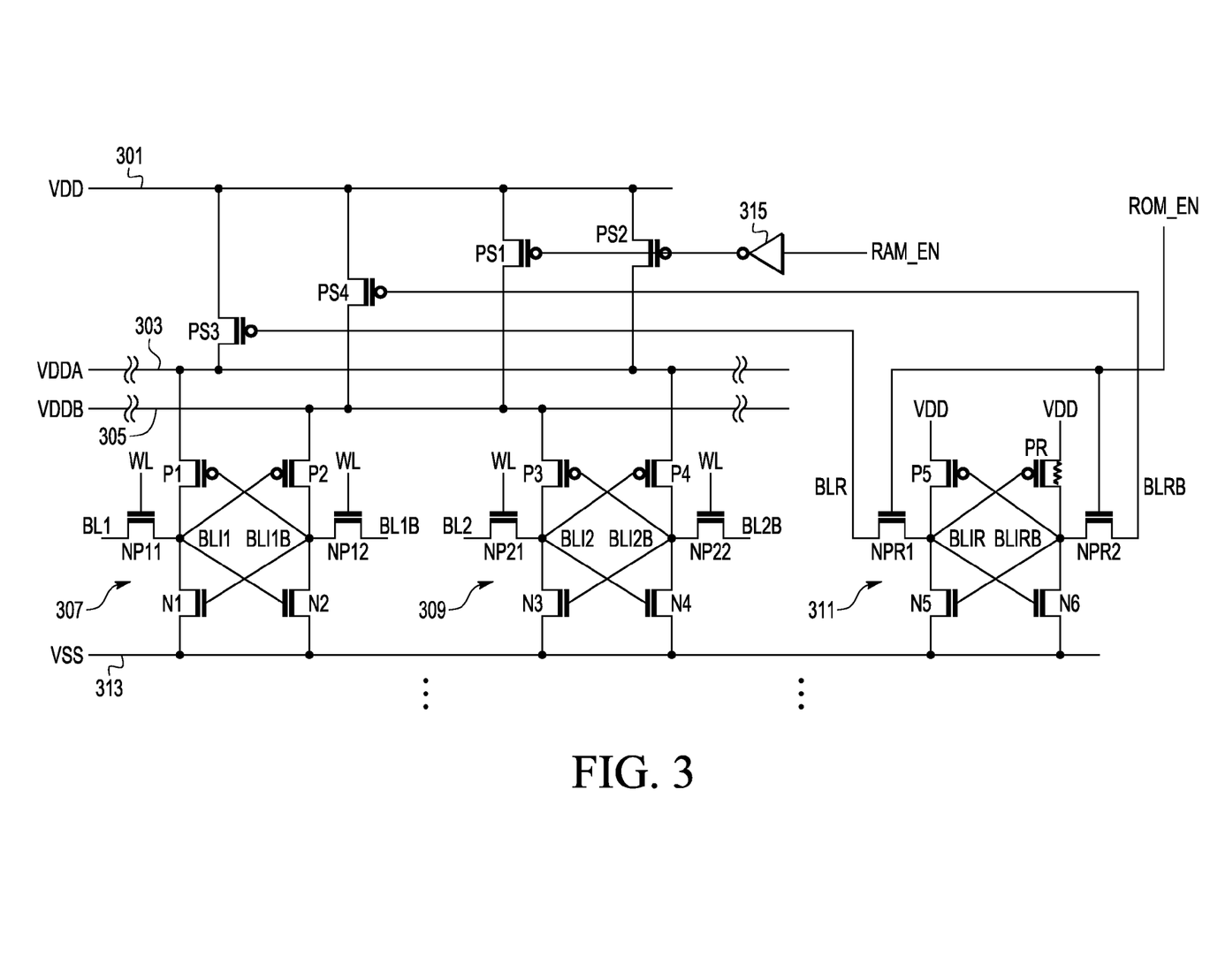
FIG. 3 is a schematic diagram of a portion of the memory array of FIG. 2 illustrating exemplary interfacing between, and operation of, a pair of RAM cells and a ROM key cell.

FIG. 3 is a schematic diagram of a portion of the memory array 201 illustrating exemplary interfacing between, and operation of, a pair of the RAM cells 207 of FIG. 2, shown in FIG. 3 as RAM cells 307 and 309, and of one of the ROM key cells 209 of FIG. 2, shown in FIG. 3 as a ROM key cell 311. The coupling of the precharge circuit 203 to the bit lines is not shown, in which the bit lines includes the bit lines for each RAM cell (e.g., 307, 309) and for each ROM key bit (e.g., BLR, BLRB) within the memory array 201. A supply bus 301 providing a supply voltage VDD is coupled to the source terminals of P-channel MOS (PMOS) transistors PS1, PS2, PS3 and PS4. A first switched bus 303 develops a voltage VDDA and a second switched bus 305 develops a voltage VDDB. It is noted that VDDB is not an inverted version of the supply voltage VDD but instead references one of two separate switched supply buses VDDA and VDDB. The drain terminals of PS2 and PS3 are coupled to the first switched bus 303 for receiving VDDA, and the drain terminals of PS1 and PS4 are coupled to the second switched bus 305 for receiving VDDB. A reference supply bus 313 develops a reference voltage VSS.

In the illustrated configuration, the RAM cells 307 and 309 are each configured according to a conventional six transistor (6-T) static RAM (SRAM) architecture. The RAM cell 307 includes PMOS transistors P1 and P2 and N-channel MOS (NMOS) transistors N1, N2, NP11 and NP12. P1 has its source terminal coupled to VDDA, its drain terminal coupled to a non-inverted internal bit node BLI1, and its gate terminal coupled to an inverted internal bit node BLI1B. P2 has its source terminal coupled to VDDB, its drain terminal coupled to BLI1B, and its gate terminal coupled to BLI1. N1 has its drain terminal coupled to BLI1, its source terminal coupled to VSS, and its gate terminal coupled to BLI1B. N2 has its drain terminal coupled to BLI1B, its source terminal coupled to VSS, and its gate terminal coupled to BLI1. The source terminals of N1 and N2 form reference terminals and the source terminals of P1 and P2 form first and second power terminals of the RAM cell 307. NP11 has its current terminals (drain and source) coupled between BLI1 and a non-inverted bit line BL1, and NP12 has its current terminals coupled between BLI1B and an inverted bit line BL1B. The gate terminals of NP11 and NP12 are coupled to receive a word line signal WL, which represents any one of the word line signals WL1-WLN. It is noted that in many situations, the drain and source terminals of individual MOS transistors may be transposed without causing a difference in behavior. In general, the drain and source terminals can be referred to as current terminals and the gate terminal is a control terminal.

The RAM cell 309 is configured in a substantially similar manner as the RAM cell 307. The RAM cell 309 includes PMOS transistors P3 and P4 and NMOS transistors N3, N4, NP21 and NP22. P3 has its source terminal coupled to VDDB, its drain terminal coupled to a non-inverted internal bit node BLI2, and its gate terminal coupled to an inverted internal bit node BLI2B. P4 has its source terminal coupled to VDDA, its drain terminal coupled to BLI2B, and its gate terminal coupled to BLI2. N3 has its drain terminal coupled to BLI2, its source terminal coupled to VSS, and its gate terminal coupled to BLI2B. N4 has its drain terminal coupled to BLI2B, its source terminal coupled to VSS, and its gate terminal coupled to BLI2. The source terminals of N3 and N4 form reference terminals and the source terminals of P3 and P4 form first and second power terminals of the RAM cell 309. NP21 has its current terminals (drain and source) coupled between BLI2 and a non-inverted bit line BL2, and NP22 has its current terminals coupled between BLI2B and an inverted bit line BL2B. The gate terminals of NP21 and NP22 are coupled to receive the word line signal WL.

The ROM key cell 311 is configured in similar manner as the RAM cells 307 and 309, except configured and coupled to perform ROM functions as further described herein. The ROM key cell 311 includes a PMOS transistor P5, NMOS transistors N5, N6, NPR1 and NPR2, and a "pseudo" PMOS transistor structure PR. P5 has its source terminal coupled to VDD, its drain terminal coupled to a non-inverted internal bit node BLIR, and its gate terminal coupled to an inverted internal bit node BLIRB. PR has its "source" terminal coupled to VDD, its "drain" terminal coupled to BLIRB, and its gate terminal coupled to BLIR. N5 has its drain terminal coupled to BLIR, its source terminal coupled to VSS, and its gate terminal coupled to BLIRB. N6 has its drain terminal coupled to BLIRB, its source terminal coupled to VSS, and its gate terminal coupled to BLIR. NPR1 has its current terminals (drain and source) coupled between BLIR and a non-inverted bit line BLR, and NPR2 has its current terminals coupled between BLIRB and an inverted bit line BLRB. The gate terminals of NPR1 and NPR2 are coupled to receive the ROM_EN signal. The bit line nodes BLR and BLRB of the ROM key cell 311 are coupled to the gate terminals of PS3 and PS4, respectively. RAM_EN is provided to the input of an inverter 315, having its output coupled to the gate terminals of pull-up devices PS1 and PS2.

Device PR of the ROM key cell 311 is configured to operate as a resistor between its drain and source terminals, which is illustrated with a resistor symbol. Since coupled directly to VDD, PR pulls its internal inverted bit node BLIRB high to VDD. BLIRB pulled high turns N5 on, so that the internal non-inverted bit node BLIR is pulled low. In this manner, when power is applied, the ROM key cell 311 is driven to a logic zero value (the state of node BLIR) regardless of the state of external control signals BLR, BLRB or ROM_EN.

In the RAM mode when RAM_EN is high and ROM_EN is low, NPR1 and NPR2 are turned off so that the ROM key cell 311 is effectively isolated from the remaining memory cells of the memory array 201. PS1 and PS2 are turned on so that both VDDA and VDDB are pulled high to VDD. Thus, in the RAM mode, the RAM cells, including cells 307 and 309, are coupled to operate according to normal SRAM operation. In the ROM mode when ROM_EN is high and RAM_EN is low, NPR1 and NPR2 are turned on so that BLR and BLRB are driven to the states of the internal nodes BLIR and BLIRB, respectively, in which these states are further conveyed to the gate terminals of PS3 and PS4, respectively. PS1 and PS2 are turned off by RAM_EN, and the ROM key cell 311 turns PS3 on and PS4 off so that VDDB is left electrically floating while VDDA is pulled high.

The RAM_EN signal is pulled high and the ROM_EN signal is pulled low by the memory controller 206 to place the memory array 201 in the RAM mode. When RAM_EN is high, the inverter 315 turns on PS1 and PS2 so that VDDA and VDDB are both pulled to the voltage level of VDD. When VDDA and VDDB are both high, the RAM cells 307 and 309 both operate according to conventional SRAM cells. Thus, the memory controller 205 may perform a write operation write a logic zero or a logic one into either one or both of the RAM cells 307 and 309 according to a conventional write operation. For example, a logic zero may be written into the RAM cell 307 by driving its internal bit nodes BLI1 and BLI1B low and high, respectively, which is latched into the RAM cell 307 after the write operation is completed. Similarly, the memory controller 205 may read the logic value(s) stored within either one or both of the RAM cells 307 and 309 by performing a conventional read operation.

The specific details of the read and write operations during the RAM mode are not described in detail as well understood by those of ordinary skill in the art. Generally, the memory controller 205 asserts the COL signal and asserts the PCHG signal to the precharge circuit 203, which precharges the bit lines BLx/BLxB high. Once the precharge completes, PCHG is pulled back low. The memory controller 205 then asserts selected word lines signal WL1-WLN during read and/or write cycles to retrieve or store information within the array of bit cells. The 6-T SRAM cell structure is configured to latch a bit to one logic state or the other (logic zero or logic one) during a write operation, in which the bit cell stores the bit when WL is negated back low. During a read operation, the latched state of the bit cell is determined by the states of the bit lines.

Figure 4:
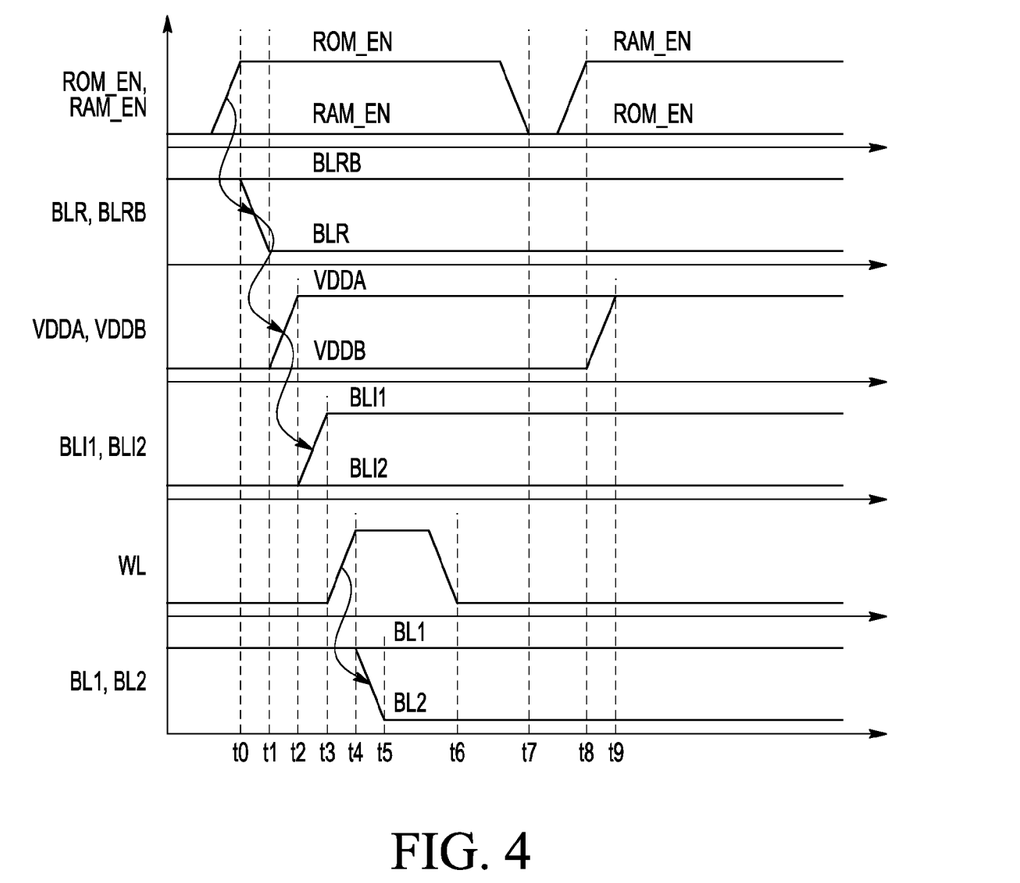
FIG. 4 is a simplified timing diagram illustrating operation of the portion of the memory array shown in FIG. 3 during the ROM mode and then switching to the RAM mode.

FIG. 4 is a simplified timing diagram plotting ROM_EN, BLR, BLRB, VDDA, VDDB, BLI1, BLI2, WL, BL1 and BL2 to illustrate operation of the portion of the memory array 201 shown in FIG. 3 during the ROM mode and then switching to the RAM mode. The timing diagram is not drawn to scale and the timing and voltage transitions are simplified for purposes of clarity. Also, the timing diagram is not intended to illustrate particular read or write cycles but instead illustrates the interaction and operation of the ROM key cell 311 and the RAM cells during the ROM mode and the control of the switched buses 303 and 305 during mode transitions. Prior to an initial time t0, RAM_EN and ROM_EN are both pulled low and the memory array 201 is initialized or reset. During initialization or reset, VDDA and VDDB are initialized low, whereas the bit lines BLx and BLxB including BLR and BLRB may be initialized high. Although not shown, the precharge circuit 203 may precharge BLR and BLRB prior to the ROM mode. At about time t0, ROM_EN is asserted high while RAM_EN remains low to enter the ROM mode of operation. Since VDD is high, PR pulls BLIRB within the ROM key cell 311 high, which turns on N5 to pull BLIR low. ROM_EN turns on NPR1 and NPR2, so that at about a time t1, BLIR pulls BLR low whereas BLRB remains high.

At about a time t2, PS3 is turned on so that VDDA is pulled high while VDDB remains low. The initial state of the internal bit nodes of the memory cells is generally low since VDDA and VDDB were both initially pulled low. At about time t3, VDDA pulls the source terminals of P1 and P4 high, which pulls BLI1 high within the RAM cell 307 and which pulls BLI2B high within the RAM cell 309. BLI2B turns on N3 so that BLI2 remains low.

The memory controller 205 pulls WL high at about time t4 after the memory cell 201 settles, which turns on NP11, NP12, NP21 and NP22. In response at about a time t5, BLI1 keeps BL1 high whereas BL2 is pulled low. In this manner, the RAM cell 307 is at a ROM state of logic one, and the RAM cell 309 is pulled to a ROM state of logic zero. The states of BL1/BL1B and BL2/BL2B may then be read by the memory system 105 to retrieve ROM information from the memory array 201. Any desired number of ROM key cells may be included to selectively control the voltage supply provided to selected ones of the RAM cells to collectively establish the ROM information stored within the memory array 201.

The memory controller 205 eventually pulls WL low, such as shown at about time t6. Subsequently, ROM_EN is pulled low at about time t7 and then RAM_EN is asserted high at about time t8 to transition to the RAM mode. ROM_EN going low turns off NPR1 and NPR2, so that the ROM key cell 311 is electrically isolated from VDDA and VDDB and thus from the RAM cells 307 and 309. Meanwhile, RAM_EN going high turns on PS1 and PS2 so that VDDB (and VDDA) are both pulled to VDD at about time t9. In the RAM mode, therefore, the RAM cells 307 and 309 are fully powered and may operate as normal SRAM cells.

The logic states of both of the RAM cells 307 and 309 during the ROM mode may be reversed based on circuit connectivity. In a first alternative case, BLR may instead be coupled to the gate terminal of PS4 whereas BLRB may instead be coupled to the gate terminal of PS3. In this first alternative case, VDDA would instead be left floating whereas VDDB would be pulled high to VDD, and the RAM cells 307 and 309 would instead be pulled to logic states zero and one, respectively, during the ROM mode. In a second alternative case, the connections of the drain terminals of PS3 and PS4 may be reversed, so that PS3 is instead coupled to VDDB and PS4 is instead coupled to VDDA. In this second alternative case, the states of the RAM cells 307 and 309 would also be reversed during the ROM mode. In a third alternative case, the connections of PR and P5 may be swapped within the ROM key cell 311, so that the ROM key cell 311 instead becomes a logic one key cell. In this third alternative case, the states of the RAM cells 307 and 309 would also be reversed during the ROM mode.

Furthermore, the logic state of either one or both of the RAM cells 307 and 309 may be reversed for the ROM mode using alternative circuit connectivity. For example, the logic state of the RAM cell 307 may be reversed by swapping the source terminal connections of P1 and P2 between VDDA and VDDB. Similarly, the logic state of the RAM cell 309 may be reversed by swapping the source terminal connections of P3 and P4 between VDDA and VDDB.

In summary, the ROM key cell 311 may be configured as a logic zero or a logic one during ROM mode based on the position of its pseudo PMOS transistor structure within the cell structure. The voltages of the switched bus voltages VDDA and VDDB during the ROM mode are based on connectivity to the ROM key cell 311. The logic state of RAM cells 307 and 309 during the ROM mode depends on their connectivity to the switched buses 303 and 305 and corresponding voltages VDDA and VDDB. As described with reference to the memory system 105 shown in FIG. 2, multiple ROM key cells 209, each similar to the ROM key cell 311, may be distributed within the memory array 201. Although not shown in FIG. 2, switched buses, similar to buses 303 and 305, are provided at least across each row of the memory array 201 which includes a ROM key cell. Alternatively, switched buses may be provided for each memory array row regardless of whether the row includes a ROM key cell or not. One or more RAM cells of each row that includes a ROM key cell have their power terminals connected to the corresponding switched buses of their respective rows (rather than to VDD) to define a stored logic value during ROM mode. The collective state of the RAM cells that are coupled to switched buses and driven to corresponding logic states during the ROM mode determine the ROM information of the memory array 201 of the memory system 105.

It is understood that the illustrated configuration is simplified. Although not shown, a reset circuit or the like may be provided to discharge the voltages of VDDA and VDDB when ROM_EN and RAM_EN are both low. Although the ROM mode is generally entered upon power on or reset (POR) of the system to retrieve and process the ROM information, it is appreciated that the memory controller 105 may be configured to switch between RAM and ROM modes during normal operation if desired.

Figure 5:
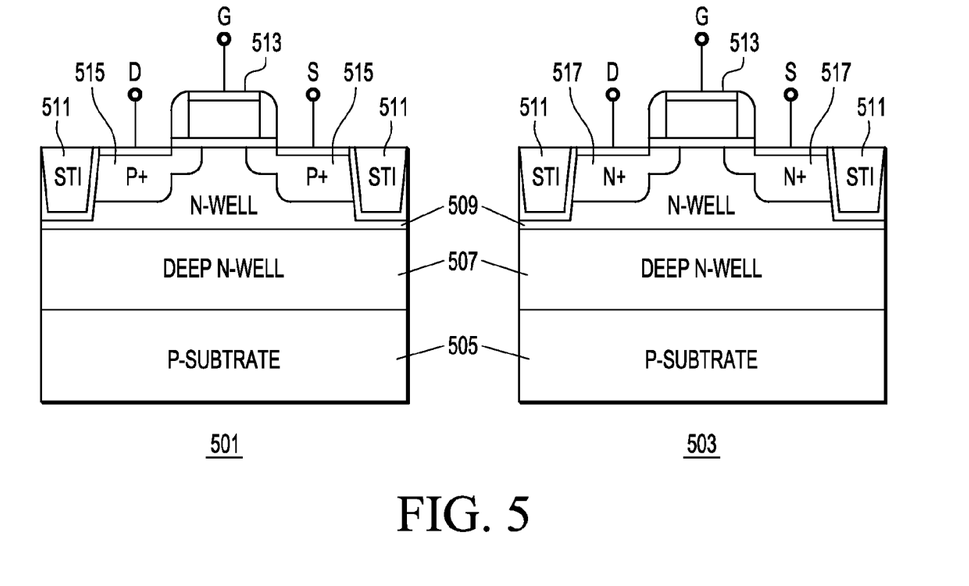
FIG. 5 is a structural diagram of a normal PMOS transistor along with a pseudo PMOS transistor structure implemented according to one embodiment.

FIG. 5 is a structural diagram of a normal PMOS transistor 501 along with a pseudo PMOS transistor structure 503 implemented according to one embodiment. As used herein, the term "pseudo" as applied to the PMOS transistor structure 503 means that the structure is fabricated in substantially the same manner and appears substantially identical to a normal memory cell structure of the transistor 501, but is made with at least one alteration that causes a modified function that enables storage of ROM information. The transistors P1-P5 of FIG. 3 may be configured similar to the normal PMOS transistor 501, whereas PR is configured similar to the pseudo PMOS transistor structure 503. Both the transistor 501 and the structure 503 may be implemented on a stacked semiconductor configuration including a lower P-substrate layer 505, an intermediate deep N-Well layer 507, and an upper N-Well layer 509. Both the transistor 501 and the structure 503 may be surrounded by a shallow trench isolation (STI) structure 515 formed within the N-Well layer 509 to prevent electrical leakage between adjacent components. Both the transistor 501 and the structure 503 may include a gate structure 513 formed on the N-Well layer 509 for interfacing the gate (G) terminal, and both include drain (D) and source (S) terminal interfaces. It is understood that alternative structures are possible and contemplated. For example, in one alternative configuration, the deep N-Well layer 507 may be omitted for both normal and pseudo structures.

It is noted that references to "N" and "P" in association with substrate layers, doping, MOS transistor types, etc., generally refer to "negative" versus "positive" or otherwise to different or even opposite polarity or conductivity types, such as N type and P type and the like. Also, the term "substrate" as used herein refers to any of N type or P type substrate layers, including upper, intermediate or deep N type (e.g., N-Well) or P type (e.g., P-Well) layers, and P+ or N+ doping regions or the like.

For the normal PMOS transistor 501, a P+ doping region 515 is formed within the N-Well layer 509 below the drain and source terminals and on either side of the gate structure 513. For the pseudo PMOS transistor structure 503, the P+ doping region 515 is replaced by an N+ doping region 517. In this manner, the doping region 517 and the substrate layer 509 are of the same polarity or conductivity type for the pseudo PMOS structure. Since the N+ doping region 517 is substantially identical in shape and appearance as the P+ doping region 515, the PMOS transistor structure 503 appears substantially identical to the normal PMOS transistor 501. Thus, the two structures are indistinguishable based solely on physical appearance. In this manner, a hacker that exposes the structure of the devices is unable to distinguish between the two.

The operation of the PMOS transistor structure 503, however, is different from that of the normal PMOS transistor 501. The effect of the N+ doping region 517 within the N-Well layer 509 (both of common conductivity type) forms a resistive path between the drain and source terminals of the pseudo PMOS transistor structure 503. Thus, when the source terminal is coupled to VDD, such as shown by PR, the normal operation of the gate terminal is bypassed or rendered inoperative and the drain terminal, if not otherwise driven to a different voltage level, is pulled to the same voltage level as the source terminal to function as a ROM key bit.

When a normal PMOS transistor is replaced by the pseudo PMOS transistor structure 503 in a normal 6-T SRAM cell, such as shown by PR of the ROM key cell 311, the normal RAM function is converted to a ROM function in which the cell is driven to a predetermined logic state. The predetermined logic state may then be used to drive a selected one of two switched buses (e.g., 303 and 305) to the VDD voltage level while allowing the other switched bus to float. As shown in FIG. 3, the connection of normal RAM cells to the switched buses determine their state during the ROM mode.

Figure 6:
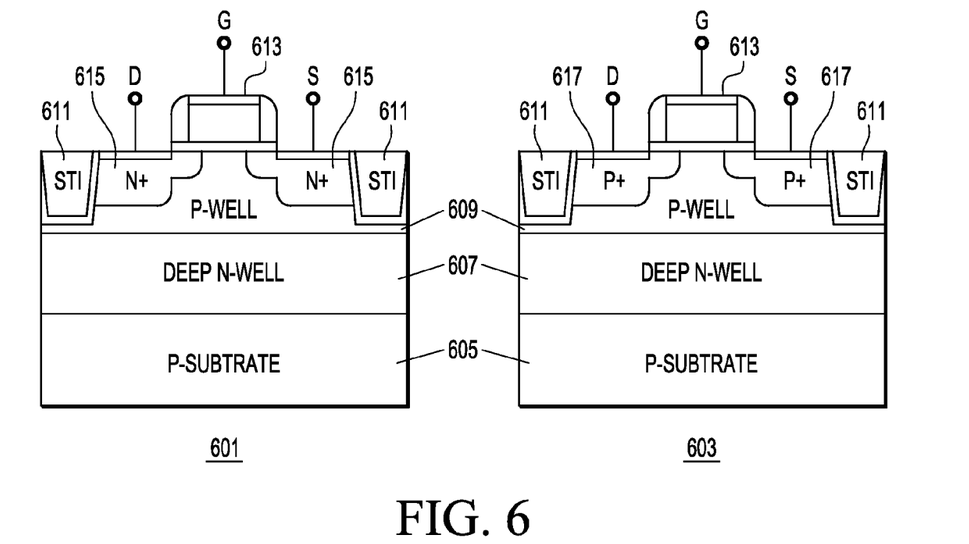
FIG. 6 is a structural diagram of a normal NMOS transistor along with a pseudo NMOS transistor structure implemented according to one embodiment.

FIG. 6 is a structural diagram of a normal NMOS transistor 601 along with a pseudo NMOS transistor structure 603 implemented according to one embodiment. As used herein, the term "pseudo" as applied to the NMOS transistor structure 603 means that the structure is fabricated in substantially the same manner and appears substantially identical to a normal memory cell structure of the transistor 601, but is made with at least one alteration that causes a modified function that enables storage of ROM information. Similar to 501 and 503, both the transistor 601 and the structure 603 may be implemented on a stacked semiconductor configuration including a lower P-substrate layer 605 and an intermediate deep N-Well layer 607. For the transistor 601 and the structure 603, however, the upper N-Well layer 509 is replaced by an upper P-Well layer 609. Both the transistor 601 and the structure 603 may be surrounded by an STI structure 615 formed within the P-Well layer 609 to prevent electrical leakage between adjacent components. Both the transistor 601 and the structure 603 may include a similar gate structure 613 formed on the P-Well layer 609 for interfacing the gate (G) terminal, and both include drain (D) and source (S) terminal interfaces. It is understood that alternative structures are possible and contemplated. For example, in one alternative configuration, the deep N-Well layer 607 may be omitted for both normal and pseudo structures.

For the normal NMOS transistor 601, an N+ doping region 615 is formed within the P-Well layer 609 below the drain and source terminals and on either side of the gate structure 613. For the pseudo NMOS transistor structure 603, the N+ doping region 615 is replaced by a P+ doping region 617. In this manner, the doping region 617 and the substrate layer 609 are of the same polarity or conductivity type for the pseudo NMOS structure. Since the P+ doping region 617 is substantially identical in shape and appearance as the N+ doping region 615, the NMOS transistor structure 603 appears substantially identical to the normal NMOS transistor 601. Thus, the two structures are indistinguishable based solely on physical appearance. In this manner, a hacker that exposes the structure of the devices is unable to distinguish between the two.

The operation of the NMOS transistor structure 603, however, is different from that of the normal NMOS transistor 601. The effect of the P+ doping region 617 within the N-Well layer 609 (both of common conductivity type) forms a resistive path between the drain and source terminals of the pseudo NMOS transistor structure 603 (similar to that described for the pseudo PMOS transistor structure 503). Thus, when the source terminal is coupled to VSS, the normal operation of the gate terminal is bypassed or rendered inoperative and the drain terminal, if not otherwise pulled to a different voltage level, is pulled to the voltage level as the source terminal to function as a ROM key bit.

Figure 7:
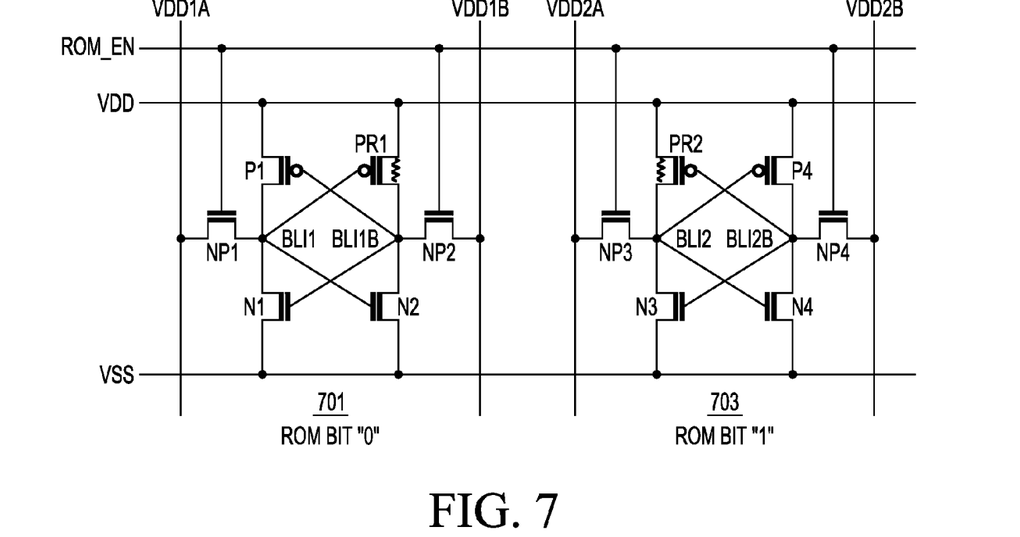
FIG. 7 is a schematic diagram of a first ROM key cell and a second ROM key cell configured with pseudo PMOS transistor structures to store opposite logic states and to drive switched supply bus pairs of different rows to opposite logic states during the ROM mode.

FIG. 7 is a schematic diagram of a first ROM key cell 701 and a second ROM key cell 703 configured with pseudo PMOS transistor structures to store opposite logic states and to drive switched supply bus pairs of different rows to opposite logic states during the ROM mode. The ROM key cell 701 includes a PMOS transistor P1, NMOS transistors N1, N2, NP1 and NP2, and a pseudo PMOS transistor structure PR1, collectively forming internal bit nodes BLI1 and BLI1B. The ROM key cell 703 includes a PMOS transistor P4, NMOS transistors N3, N4, NP3 and NP4, and a pseudo PMOS transistor structure PR2, collectively forming internal bit nodes BLI2 and BLI2B. The pseudo PMOS transistor structures PR1 and PR2 may each be implemented according to the pseudo PMOS transistor structure 503. The ROM key cell 701 is configured in substantially the same manner as the ROM key cell 311 in which PR1 (similar to PR of FIG. 3) has its drain and source terminals coupled between VDD and internal inverted bit node BLI1B, so that it stores a logic zero during ROM mode (hence, ROM bit "0"). PR1 pulls BLI1B high to VDD turning on N1 pulling BLI1 low. The ROM key cell 703 is configured a similar manner except that PR2 has its drain and source terminals coupled between VDD and internal non-inverted bit node BLI2, so that it stores a logic one during ROM mode (hence, ROM bit "1"). PR2 pulls BLI2 high to VDD turning on N4 to pull BLI2B low.

ROM_EN is provided to the gate terminals of NP1, NP2, NP3 and NP4. NP1 has its current terminals (drain and source) coupled between BLI1 and a first switched supply bus VDD1A for a selected row of a memory array, and NP2 has its current terminals coupled between BLI1B and a second switched supply bus VDD1B of the same row of the memory array. Similarly, NP3 has its current terminals coupled between BLI2 and a first switched supply bus VDD2A for another and different row of the memory array, and NP4 has its current terminals coupled between BLI2B and a second switched supply bus VDD2B of the other row of the memory array. When ROM_EN goes high enabling the ROM mode, transistors NP1, NP2, NP3 and NP4 are turned on so that VDD1A is driven to the state of BLI1, VDD1B is driven to the state of BLI1B, VDD2A is driven to the state of BLI2, and VDD2B is driven to the state of BLI2B.

In this manner, the bit lines of the ROM key cell 701 are coupled to control the power states of a pair of switched buses VDD1A/VDD1B in a similar manner as the ROM key cell 311 controls the power state of the switched buses 303 and 305. Similarly, the bit lines of the ROM key cell 703 are coupled to control the power states of a different pair of switched buses VDD2A/VDD2B. The switched buses VDD1A/VDD1B controlled by the ROM key cell 701 in the ROM mode activate the ROM mode of a first set of RAM cells (one or more) within the same row and coupled to VDD1A/VDD1B, and the switched buses VDD2A/VDD2B controlled by the ROM key cell 703 in the ROM mode activate the ROM mode of a second set of RAM cells (one or more) within that same row and coupled to VDD2A/VDD2B. In this manner, the ROM information may include any number of RAM cells up to the total number of RAM cells in the memory array 201.

Figure 8:
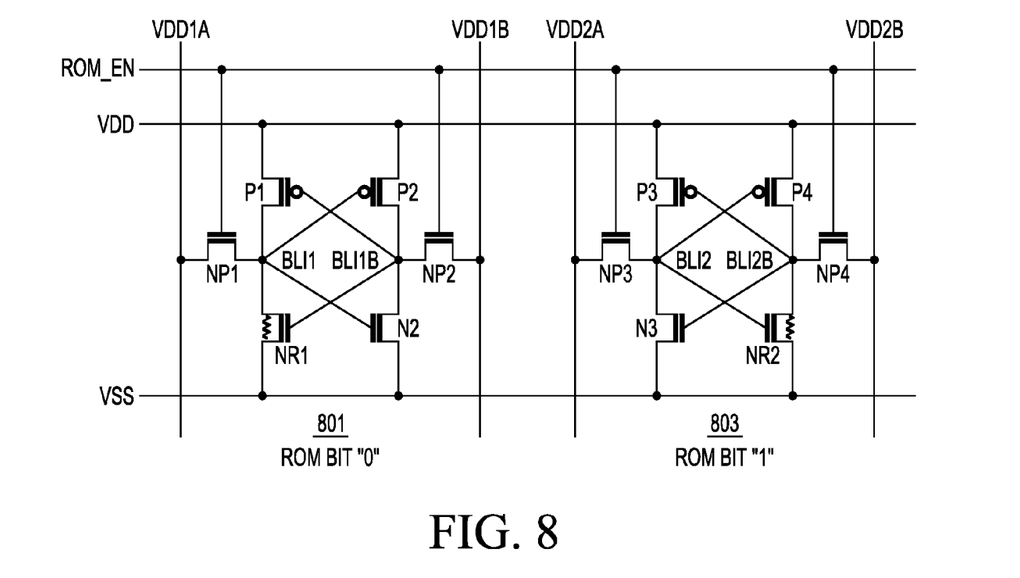
FIG. 8 is a schematic diagram of a first ROM key cell and a second ROM key cell configured with pseudo NMOS transistor structures to store opposite logic states and to drive switched supply bus pairs of different rows to opposite logic states during the ROM mode.

FIG. 8 is a schematic diagram of a first ROM key cell 801 and a second ROM key cell 803 configured with pseudo NMOS transistor structures to store opposite logic states and to drive switched supply bus pairs of different rows to opposite logic states during the ROM mode. The ROM key cell 801 is similar to the ROM key cell 701, except that the pseudo PMOS transistor structure PR1 is replaced by PMOS transistor P2, and the NMOS transistor N1 is replaced by a pseudo NMOS transistor structure NR1. In a similar manner, the ROM key cell 803 is similar to the ROM key cell 703, except that the pseudo PMOS transistor structure PR2 is replaced by PMOS transistor P3, and the NMOS transistor N4 is replaced by a pseudo NMOS transistor structure NR2. The pseudo NMOS transistor structures NR1 and NR2 may each be implemented according to the pseudo NMOS transistor structure 603. The ROM key cells 801 and 803 are coupled to VDD, VSS, ROM_EN, VDD1A, VDD1B, VDD2A and VDD2B in the same manner as the ROM key cells 701 and 703, respectively.

The ROM key cell 801 functions as a ROM bit "0" in a similar manner as the ROM key cell 701, except that rather PR1 pulling BLI1B high to VDD, NR1 pulls BLI1 low to VSS. The effect is the same in that when ROM_EN is pulled high, VDD1A is pulled low whereas VDD1B is pulled high. Similarly, the ROM key cell 803 functions as a ROM bit "1" in a similar manner as the ROM key cell 703, except that rather PR2 pulling BLI2 high to VDD, NR2 pulls BLI2B low to VSS. The effect is the same in that when ROM_EN is pulled high, VDD2A is pulled high whereas VDD2B is pulled low.

The ROM key cells 701, 703, 801 and 803 are each modified in which a single MOS transistor (PMOS or NMOS) is replaced by a pseudo MOS structure so that the ROM key cell stabilizes to a predetermined logic state when power is provided between VDD and VSS. In an alternative configuration, any of the key cells may include two pseudo MOS structures of opposite polarity type at opposite positions of the cell structure. The opposite polarity types and positions ensure that the functions of the pseudo MOS structures cooperate rather than conflict with each other. For example, for the ROM key cell 701, N1 could also be replaced by a pseudo NMOS structure to pull bit node BLI1 low while PR1 pulls BLI1B high. Similarly, for the ROM key cell 803, P3 could also be replaced by a pseudo PMOS structure to pull bit node BLI2 high while NR2 pulls BLI2B low. The use of a combination of pseudo MOS structures may enhance stability.

Figure 9:
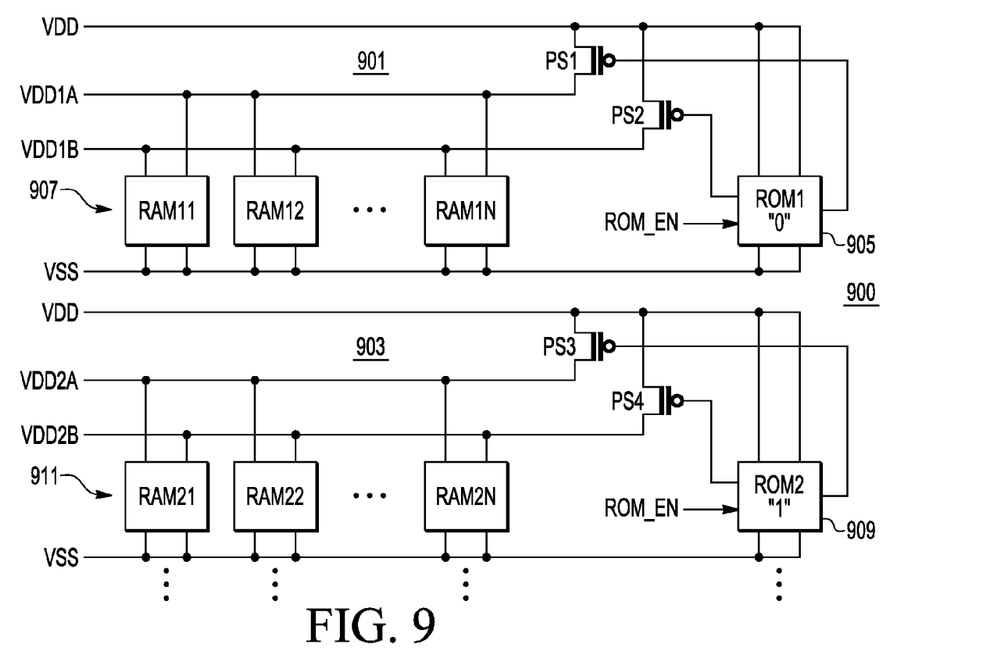
FIG. 9 is a simplified block diagram of a portion of a memory array implemented according to one embodiment in which one switched supply bus is pulled high and the other is floated during the ROM mode for enabling access to ROM information.

FIG. 9 is a simplified block diagram of a portion of a memory array 900 implemented according to one embodiment. The memory array 900 includes a first row 901 of memory cells, a second row 903 of memory cells, along with any number of additional rows of memory cells depending upon the size of the memory array 900. It is noted that as used throughout this disclosure the terms "row" and "column" may be interchangeable and/or that a given memory array may have any organization or structure. Also, the "first" and "second" rows 901 and 903 may each reference any selected row or memory line in the memory array 900. Each row includes supply voltage buses VDD and VSS for providing power to individual memory cells. Row 901 includes a ROM key cell 905 (ROM1), a set of "N" RAM cells 907, individually labeled RAM11, RAM12, . . . , RAM1N, and switched supply buses VDD1A and VDD1B. Row 903 includes a ROM key cell 909 (ROM2), another set of "N" RAM cells 911, individually labeled RAM21, RAM22, . . . , RAM2N, and switched supply buses VDD2A and VDD2B. The ROM key cells 905 and 909 are each enabled by the ROM enable signal ROM_EN.

The ROM key cell 905 has its non-inverted bit line coupled to the gate terminal of a PMOS transistor PS2, and its inverted bit line coupled to the gate terminal of another PMOS transistor PS1. Similarly, the ROM key cell 909 has its non-inverted bit line coupled to the gate terminal of another PMOS transistor PS4, and its inverted bit line coupled to the gate terminal of another PMOS transistor PS3. PS1, PS2, PS3 and PS4 have their source terminals coupled to VDD. The drain terminal of PS1 is coupled to VDD1A, the drain terminal of PS2 is coupled to VDD1B, the drain terminal of PS3 is coupled to VDD2A, and the drain terminal of PS4 is coupled to VDD2B.

The block diagram of FIG. 9 is simplified in that many circuits and features of the memory array and the memory cells are not shown for clarity of illustration. For example, the precharge circuitry for precharging the bit lines is omitted. Also, each of the ROM key cells 905 and 909 are shown in simplified block form, in which the ROM key cell 905 may be configured similar to the ROM key cells 701 or 801 and the ROM key cell 909 may be configured similar to the ROM key cells 703 or 803. The RAM cells RAM11-RAM1N and RAM21-RAM2N are also shown in simplified block form in which each may be configured similar to the RAM cells 307 or 309. Each RAM cell has upper left and upper right power terminals for coupling to a supply voltage (e.g., normally VDD), and lower left and lower right reference terminals for coupled to a reference supply voltage (e.g., VSS). Also, a RAM enable circuit, such as PMOS transistors (similar to PS1 and PS2 of FIG. 3) receiving the RAM enable signal RAM_EN, may be provided but is not shown. As previously described with reference to FIG. 3, when ROM_EN is negated low and RAM_EN is asserted high for the RAM mode, the ROM key cells 905 and 909 are disabled and the switched supply buses VDD1A, VDD1B, VDD2A and VDD2B are pulled to the voltage level of supply voltage VDD. In the RAM mode, the RAM cells RAM11-RAM1N and RAM21-RAM2N operate as normal or standard RAM cells as previously described. Further, the individual bit lines of each of the RAM cells are not shown.

In the ROM mode when ROM_EN is asserted high (and RAM_EN negated low), the ROM key cells 905 and 909 are enabled to control the voltage level of the switched supply buses VDD1A, VDD1B, VDD2A and VDD2B. The ROM key cell 905 operates as a ROM bit "0" in which it turns on PS2 pulling VDD1B high and turns off PS1 so that VDD1A is floated. The RAM cells RAM11-RAM1N of the row 901 each have first and second power terminals similar to that of the RAM cells 307 and 309. As shown, RAM11 and RAM1N each have their left power terminals coupled to VDD1B and their right power terminals coupled to VDD1A. Since VDD1B is pulled high in the ROM mode by the ROM key cell 905, RAM11 and RAM1N are each pulled to a logic "1" in the ROM mode. The RAM cell RAM12 is coupled in an opposite manner having its left power terminal coupled to VDD1A and its right power terminal coupled to VDD1B. Thus, RAM12 is pulled to a logic "0" in the ROM mode.

The ROM key cell 909 operates as a ROM bit "1" in which it turns on PS3 pulling VDD2A high and turns off PS4 so that VDD2B is floated. The RAM cells RAM21, RAM22 and RAM2N of row 903 are each coupled in the same manner, having their left power terminals coupled to VDD2A and their right power terminals coupled to VDD2B. Since VDD2A is pulled high, the RAM cells RAM21, RAM22 and RAM2N of row 903 are each pulled to a logic "1" during the ROM mode.

In general, the ROM information embedded within the memory array 900 is determined by inclusion of ROM key cells coupled to control the voltage of each of the switched supply buses in the ROM mode, and the selected coupling of RAM cells in corresponding memory rows to the switched supply buses. The ROM key cells may be configured as a ROM bit "0" or as a ROM bit "1" in which each has its non-inverted bit line terminal coupled to one of the switched supply buses and has its inverted bit line terminal coupled to the other one of the switched supply buses. Each RAM cell configured to form a ROM bit has its left power terminal coupled to one of the switched supply buses and has its right power terminal coupled to the other one of the switched supply buses for determining its logic state in the ROM mode.

Figure 10:
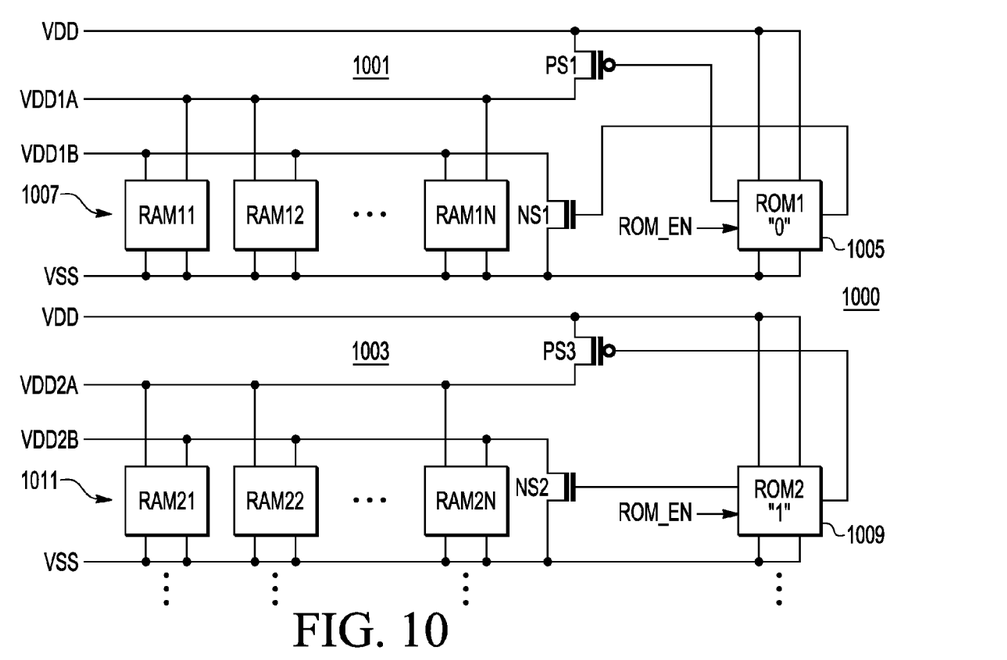
FIG. 10 is a simplified block diagram of a portion of a memory array implemented according to an alternative embodiment for improved stability in which one switched supply bus is pulled high and the other is pulled low during the ROM mode for enabling access to ROM information.

FIG. 10 is a simplified block diagram of a portion of a memory array 1000 implemented according to an alternative embodiment. The memory array 1000 includes a first row 1001 including the N memory cells RAM11-RAM1N, a second row 1003 of the N memory cells RAM21-RAM2N, along with any number of additional rows of memory cells depending upon the size of the memory array 1000 similar to the memory array 900. Each row includes supply voltage buses VDD and VSS for providing power to individual memory cells. Row 1001 includes a "0" bit type ROM key cell 1005 (ROM1) enabled by the ROM enable signal ROM_EN along with switched supply buses VDD1A and VDD1B, and row 1003 includes a "1" bit type ROM key cell 1009 (ROM2) enabled by the ROM enable signal ROM_EN along with switched supply buses VDD2A and VDD2B. The ROM key cells 1005 and 1009 are coupled between VDD and VSS in similar manner as the ROM key cells 905 and 909. Also, similar to that shown in FIG. 9, row 1001 includes PS1 having its source terminal coupled to VDD and its drain terminal coupled to VDD1A, and row 1003 includes PS3 having its source terminal coupled to VDD and its drain terminal coupled to VDD2A.

Contrary to that shown in FIG. 9, however, PS2 is replaced by an NMOS transistor NS1, and PS4 is replaced by another NMOS transistor NS2. NS1 has its drain terminal coupled to VDD1B and its source terminal coupled to VSS, and NS2 has its drain terminal coupled to VDD1B and its source terminal coupled to VSS. In row 1001, the non-inverting bit line of the ROM key cell 1005 is coupled to the gate terminal of PS1, and its inverting bit line is coupled to the gate terminal of NS1. In row 1003, the non-inverting bit line of the ROM key cell 1009 is coupled to the gate terminal of NS2, and its inverting bit line is coupled to the gate terminal of PS3.

In a similar manner described for FIG. 9, the block diagram of FIG. 10 is simplified in that many circuits and features of the memory array and the memory cells are not shown for clarity of illustration. For example, the precharge circuitry for precharging the bit lines is omitted. Also, the ROM key cells 1005 and 1009 are shown in simplified block form similar to the ROM key cells 905 and 909. The RAM cells RAM11-RAM1N and RAM21-RAM2N are also shown in simplified block form. Also, a RAM enable circuit, such as PMOS transistors (similar to PS1 and PS2 of FIG. 3) receiving the RAM enable signal RAM_EN, is provided but not shown, in which VDD1A, VDD1B, VDD2A and VDD2B are all pulled to the voltage level of VDD during the RAM mode. In the RAM mode, the RAM cells RAM11-RAM1N and RAM21-RAM2N operate as normal or standard RAM cells as previously described. Further, the individual bit lines of each of the RAM cells are not shown.

When ROM_EN is negated low, the ROM key cells 1005 and 1009 are disabled allowing the ram cells RAM11-RAM and RAM12-RAM1N to operate as normal RAM cells in the RAM mode. Although not shown, before entering the ROM mode, the non-inverting bit lines of both of the ROM key cells 1005 and 1009 are precharged low (to VSS) whereas the inverting bit lines of both of the ROM key cells are precharged high (to VDD). In the ROM mode when ROM_EN is asserted, the ROM key cells 1005 and 1009 are enabled. In the ROM mode, the ROM key cell 1005 operates as a ROM bit "0" in which it turns on PS1 pulling VDD1A high and also turns on NS1 so that VDD1B is pulled down to the voltage level of VSS. In the ROM mode, the ROM key cell 1009 operates as a ROM bit "1" in which it turns on PS3 pulling VDD2A high and also turns on NS2 so that VDD2B is pulled down to the voltage level of VSS. In this manner, the ROM key cell bit line control is swapped between types "0" and "1" for controlling ROM enable devices PS1/NS1 and PS3/NS2.

The RAM cells RAM11-RAM1N each have their power terminals coupled to VDD1A and VDD1B in a similar manner as shown in FIG. 9. As shown, RAM11 and RAM1N each have their left power terminals coupled to VDD and their right power terminals coupled to VDD1A. Since VDD1A is pulled high and VDD1B is pulled low by the ROM key cell 1005 in the ROM mode, RAM11 and RAM1N are each pulled to a logic "0" in the ROM mode. The RAM cell RAM12 is coupled in an opposite manner having its left power terminal coupled to VDD1A and its right power terminal coupled to VDD1B. Thus, RAM12 is pulled to a logic "1" in the ROM mode. In the ROM mode, the ROM key cell 1009 pulls VDD2A high and VDD2B low, so that each of the RAM cells RAM21-RAM2N are pulled to the logic state "1" in the ROM mode.

As with the memory array 900, the ROM information embedded within the memory array 1000 is also determined by inclusion of ROM key cells coupled to control the voltage of each of the switched supply buses in the ROM mode, and the selected coupling of RAM cells in corresponding memory rows to the switched supply buses. The ROM key cells may be configured as a ROM bit "0" or as a ROM bit "1" and are coupled to control the voltages of the switched supply buses. Each RAM cell configured as a ROM bit has its left power terminal coupled to one of the switched supply buses and has its right power terminal coupled to the other one of the switched supply buses for determining its logic state in the ROM mode. The configuration of the memory array 1000 operates in a similar manner as that of the memory array 900, but improves RAM cell stability somewhat by pulling one of the power terminals to the reference supply voltage level VSS rather than simply allowing it to electrically float. The precharge operation is also modified somewhat to ensure proper operation in the RAM mode.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive logic or negative logic may be used in various embodiments in which the present invention is not limited to specific logic polarities, device types or voltage levels or the like.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A memory array, comprising:
   an upper supply bus developing a supply voltage level relative to a reference voltage level developed on a lower supply bus;
   a first switched supply bus and a second switched supply bus;
   a plurality of RAM cells, each having a RAM cell structure with a first power terminal and a second power terminal and configured to operate as a RAM cell when the memory array is in a RAM mode, wherein for each of said plurality of RAM cells, said first power terminal is coupled to one of said first and second switched supply buses and wherein said second power terminal is coupled to the other one of said first and second switched supply buses;
   a ROM cell comprising said RAM cell structure with first and second power terminals coupled to said upper supply bus, said ROM cell having at least one transistor that is modified so that said ROM cell settles to a predetermined logic state in either one of said RAM mode or a ROM mode, wherein said predetermined logic state is the same logic state in either one of said RAM mode and said ROM mode;
   a RAM enable circuit that couples said first and second switched supply buses to said upper supply bus in said RAM mode, and that does not couple said first and second switched supply buses to said upper supply bus in said ROM mode; and
   a ROM enable circuit that enables first and second bit lines of said ROM cell to couple only one of said first and second switched supply buses to said upper supply bus in said ROM mode so that each of said plurality of RAM cells operates as a ROM memory cell by settling to a predetermined logic state when the memory array is in said ROM mode, wherein said predetermined logic state of each of said plurality of RAM cells depends upon said predetermined logic state of said ROM cell.

2. The memory array of claim 1, wherein:
   said RAM cell structure comprises a 6-T SRAM architecture; and
   wherein said ROM cell comprises said 6-T SRAM architecture in which each of at least one MOS transistor of said 6-T SRAM architecture has been replaced by a pseudo MOS transistor structure having a substrate that is configured to form a resistance between a drain terminal and a source terminal.

3. The memory array of claim 2, wherein a doping region is formed within said substrate in which said doping region and said substrate have a common conductivity type.

4. The memory array of claim 1, wherein said ROM enable circuit enables said ROM cell in said ROM mode to allow the other one of said first and second switched supply buses to float.

5. The memory array of claim 1, wherein said ROM enable circuit enables said ROM cell in said ROM mode to couple the other one of said first and second switched supply buses to said lower supply bus.

6. The memory array of claim 1, wherein:
   said ROM enable circuit comprises:
      a first transistor having current terminals coupled between said upper supply bus and said first switched supply bus and having a control terminal coupled to said first bit line of said read only memory cell; and
      a second transistor having current terminals coupled between said upper supply bus and said second switched supply bus and having a control terminal coupled to said second bit line of said read only memory cell; and
   wherein said read only memory cell comprises:
      a third transistor having current terminals coupled between a non-inverted bit line terminal and said ROM enable circuit and having a control terminal receiving a mode control signal; and
      a fourth transistor having current terminals coupled between an inverted bit line terminal and said ROM enable circuit and having a control terminal receiving said mode control signal.

7. The memory array of claim 1, wherein:
   said ROM enable circuit comprises:
      a first transistor having current terminals coupled between said upper supply bus and said first switched supply bus and having a control terminal coupled to said first bit line of said ROM cell; and
      a second transistor having current terminals coupled between said lower supply bus and said second switched supply bus and having a control terminal coupled to said second bit line of said ROM cell; and
   wherein said read only memory cell comprises:
      a third transistor having current terminals coupled between a non-inverted bit line terminal and said ROM enable circuit and having a control terminal receiving a mode control signal; and
      a fourth transistor having current terminals coupled between an inverted bit line terminal and said ROM enable circuit and having a control terminal receiving said mode control signal.

8. The memory array of claim 1,
   wherein said ROM cell comprises:
      a first PMOS transistor having current terminals coupled between said upper supply bus and a first bit node and having a gate terminal coupled to a second bit node; and
      a pseudo PMOS transistor structure having current terminals coupled between said upper supply bus and said second bit node and having a gate terminal coupled to said first bit node.

9. The memory array of claim 1,
   wherein said ROM cell comprises:
      a first NMOS transistor having current terminals coupled between a first bit node and said lower supply bus and having a gate terminal coupled to a second bit node; and
      a pseudo NMOS transistor structure having current terminals coupled between said second bit node and said lower supply bus and having a gate terminal coupled to said first bit node.

10. A memory system, comprising:
    an upper supply bus and a lower supply bus;
    a first switched supply bus and a second switched supply bus;
    a RAM enable circuit that pulls said first switched supply bus and said second switched supply bus to a voltage of said upper supply bus when a RAM mode signal indicates a RAM mode, and that otherwise releases said first switched supply bus and said second switched supply bus;

a plurality of RAM cells, each having an SRAM cell structure operative as an SRAM memory cell in said RAM mode, and each including a first power terminal coupled to one of said first and second switched supply buses and having a second power terminal coupled to the other of said first and second switched supply buses;

a ROM cell comprising said SRAM cell structure coupled to said upper supply bus and said lower supply bus in which said SRAM cell structure of said ROM cell includes at least one transistor that is modified to transition said ROM cell to a predetermined logic state in either one of said RAM mode or said ROM mode, wherein said predetermined logic state is the same logic state in either one of said RAM mode and a ROM mode; and a ROM enable circuit coupled between said ROM cell and said first and second switched supply buses, wherein said ROM enable circuit enables first and second bit lines of said ROM cell to pull only one of said first and second switched supply buses to said voltage of said upper supply bus in said ROM mode based on said predetermined logic state of said ROM cell in which each of said plurality of RAM cells operates as a ROM memory cell by settling to a predetermined logic state in said ROM mode, and wherein said predetermined logic state of each of said plurality of RAM cells depends upon said predetermined logic state of said ROM cell.

11. The memory system of claim 10, wherein:
said ROM cell comprises:
  a first NMOS transistor having current terminals coupled between a first bit node and a first bit line and having a control terminal receiving a ROM mode signal indicative of said ROM mode; and
  a second NMOS transistor having current terminals coupled between a second bit node and a second bit line and having a control terminal receiving said ROM mode signal; and
wherein said ROM enable circuit comprises:
  a first PMOS transistor having current terminals coupled between said upper supply bus and said first switched supply bus and having a control terminal coupled to said first bit line; and
  a second PMOS transistor having current terminals coupled between said upper supply bus and said second switched supply bus and having a control terminal coupled to said second bit line.

12. The memory system of claim 10, wherein:
said ROM cell comprises:
  a first NMOS transistor having current terminals coupled between a first bit node and a first bit line and having a control terminal receiving a ROM mode signal indicative of said ROM mode; and
  a second NMOS transistor having current terminals coupled between a second bit node and a second bit line and having a control terminal receiving said ROM mode signal; and
wherein said ROM enable circuit comprises:
  a PMOS transistor having current terminals coupled between said upper supply bus and said first switched supply bus and having a control terminal coupled to said first bit line; and
  a third NMOS transistor having current terminals coupled between said lower supply bus and said second switched supply bus and having a control terminal coupled to said second bit line.

13. The memory system of claim 10, wherein said plurality of RAM cells comprises:
  a first RAM cell comprising a first power terminal coupled to said first switched supply bus and a second power terminal coupled to said second switched supply bus, wherein said first RAM cell settles to a first logic state during said ROM mode; and
  a second RAM cell comprising a first power terminal coupled to said second switched supply bus and a second power terminal coupled to said first switched supply bus, wherein said second RAM cell settles to a second logic state during said ROM mode.

14. The memory system of claim 10, wherein said ROM cell comprises a pseudo MOS transistor structure having current terminals coupled between an internal bit node and one of said upper and lower supply buses.

15. The memory system of claim 14, wherein said pseudo MOS transistor structure comprises a pseudo PMOS transistor structure having current terminals coupled between said internal bit node and said upper supply bus.

16. The memory system of claim 14, wherein said pseudo MOS transistor structure comprises a pseudo NMOS transistor structure having current terminals coupled between said internal bit node and said lower supply bus.

17. A method of providing a memory array on a semiconductor substrate with RAM and embedded ROM, comprising:
  forming an SRAM cell having an SRAM cell structure with a first power terminal coupled to a first switched supply node and with a second power terminal coupled to a second switched supply node;
  providing a RAM enable circuit, responsive to a RAM mode input, that couples the first and second switched supply nodes to a supply voltage node in a RAM mode;
  forming a ROM cell having the SRAM cell structure coupled to the supply voltage node, wherein said forming a ROM cell comprises forming the SRAM cell structure that is modified with at least one pseudo MOS transistor so that the ROM cell settles to a predetermined logic state in either the RAM mode or a ROM mode when powered, wherein the predetermined logic state is the same logic state in either one of the RAM mode and the ROM mode; and
  forming a ROM enable circuit, responsive to a ROM mode input, that enables first and second bit lines of the ROM cell to couple only one of the first and second switched supply nodes to the supply voltage node in the ROM mode so that the SRAM cell operates as a ROM memory cell that settles to a predetermined logic state based on the predetermined logic state of the ROM cell.

18. The method of claim 17, wherein said forming a ROM enable circuit comprises enabling the first and second bit lines of the ROM cell to allow the other one of the first and second switched supply nodes to float in the ROM mode.

19. The method of claim 17, wherein said forming a ROM enable circuit comprises enabling the first and second bit lines of the ROM cell to couple the other one of the first and second switched supply nodes to a reference voltage node in the ROM mode.

20. The method of claim 17, wherein said forming at least one pseudo MOS transistor structure comprises doping a substrate to operate as a resistance between drain and source terminals.

* * * * *